United States Patent [19]
Dethlefsen et al.

[11] 3,953,804
[45] Apr. 27, 1976

[54] SWITCHING ARRANGEMENT FOR THE PRODUCTION OF SEQUENTIAL CURRENT PULSES

[75] Inventors: Hans Dethlefsen; Alfred Hauenstein; Karl-Heinz Vogl, all of Munich, Germany

[73] Assignee: Siemens Atkiengesellschaft, Berlin & Munich, Germany

[22] Filed: Nov. 14, 1974

[21] Appl. No.: 523,725

[30] Foreign Application Priority Data
Nov. 14, 1973 Germany............................. 2356875

[52] U.S. Cl.............................. 328/130; 307/293; 315/323; 328/131
[51] Int. Cl.² ..................... G01R 29/02; H03K 5/00
[58] Field of Search ........... 328/130, 131; 315/323; 307/293

[56] References Cited
UNITED STATES PATENTS

| | | |
|---|---|---|
| 3,142,780 | 7/1964 | Rich............................. 315/323 X |
| 3,311,757 | 3/1967 | Matsumoto..................... 328/130 X |
| 3,560,769 | 2/1971 | Shimizu ............................. 328/130 |
| 3,639,844 | 2/1972 | Karklys............................. 328/130 |
| 3,725,794 | 4/1973 | Asplund............................. 328/130 |
| 3,859,543 | 1/1975 | Milovancevic..................... 328/130 |

Primary Examiner—Saxfield Chatmon, Jr.
Attorney, Agent, or Firm—Hill, Gross, Simpson, Van Santen, Steadman, Chiara & Simpson

[57] ABSTRACT

The invention relates to a switching arrangement for the production of sequential current pulses such as for the control of flashing systems wherein the firing order can be achieved electronically. The invention further provides for a switching arrangement for sequential firing of blasting charges. Specific marginal conditions such as the maintenance of a minimum time interval between two successive explosions, due to the ratios of pressure waves, are given in the preferred embodiment.

3 Claims, 3 Drawing Figures

SWITCHING ARRANGEMENT FOR THE PRODUCTION OF SEQUENTIAL CURRENT PULSES

BACKGROUND OF THE INVENTION

1. Field of the Invention

The present invention provides a switching arrangement wherein a firing order can be activated electronically. This results in maximum reliability and greater safety. The electronic switching arrangement minimizes the dangers inherent in the conventional systems such as fire and corrosion.

2. Prior Art

Conventional blasting processes utilize a detonator cable set on fire by electrically igniting a detonator consisting of black powder or boron pallets. The detonator cable comprises some twenty 1 m. long fuse cords located at intervals of about 30 cm. and at each end one detonator such as a dynamite rod. The detonation of the first dynamite rod can take place only after several successive fuse cords have caught fire from the detonator cable. This delay can also be achieved by appropriately spacing the fuses from each other. With careful application, up to 300 successive explosions can be carried out with a single blasting charge. There are nevertheless great difficulties inherent in this system in respect to fire danger and danger of corrosion. Also, in case of improper treatment, the detonator cable can be damaged and the firing order can be interrupted.

SUMMARY OF THE INVENTION

The object of the present invention is to provide a switching arrangement wherein a firing order can be activated electronically without limiting the use to this specific case.

The object of the invention is realized by a switching arrangement having several pulse units connected in series producing each time one pulse of a series of pulses wherein each pulse unit comprises an energy storage field, an oscillator, a frequency divider with two outputs for two signals of different delay time, and two switches of which the first one is self-holding.

Each energy storage field is connected to a joint feed line for the purpose of simultaneous charging and directed to the oscillator circuit and the frequency divider as supply voltage source by means of the first switch wherein said switch is activated by either the first output signal of the frequency divider of the preceding serially connected pulse unit or a starting pulse. The energy storage field is also connected as an energy source for the current pulse by means of the second switch which is activated by the second output signal of the frequency divider of the same pulse unit having the longer delay time.

In comparison to the conventional use of fuse cords, the electronic detonator, with the aid of a switching arrangement according to the invention, provides for an element of safety in that only electrical lines are used. A safe operation of the series of current pulses is guaranteed by the fact that all energy storage fields are charged simultaneously and independently of the number of pulse units and of the position within the series of sequentially connected current pulse units. This allows the main current supply through the feed line shortly prior to and during the blasting process to definitely fail without influencing the electronic firing of a blasting charge.

When advantageously making use of capacitors as energy storages, it is important that the charging take place for a requisite length of time. Thus, it is sometimes necessary to activate the capacitors prior to utility especially if they were previously in storage for a longer period of time.

For tolerance reasons, it is of advantage for the two required delay times that only a single time-determining member, namely the oscillator, be used and that the two delay times are produced via the frequency divider. Beyond this, capacitors with great capacitance need not be used. The oscillator is advantageously provided with a ceramic resonator.

An advantageous embodiment of the invention lies in the fact that the frequency divider consists of two divider steps which are connected in series and that these divider steps and the switching steps are designed of flip-flops. Thereby, the first divider step divides the frequency offered by the oscillator to a frequency having a period in the length of the shorter delay time. This frequency is divided by the second divider step to the frequency with the period of the longer delay time.

In a further advantageous embodiment of a switching arrangement in accordance with the invention, a switching means is provided which sets the flip-flops of the divider steps into the basic switching state when the supply voltage is switched on.

DESCRIPTION OF PREFERRED EMBODIMENT

Figure 1:
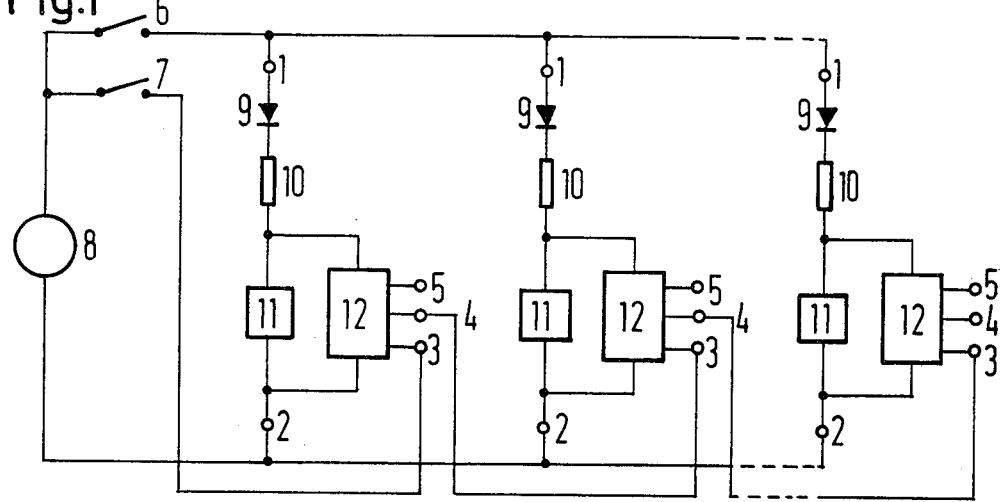
In FIG. 1 depict a switching arrangement with three current pulse units in accordance with the invention.

FIG. 1 comprises the illustration of three equally designed pulse units. Each pulse unit has two terminals 1 and 2 for switching on a supply voltage, and each has an input terminal 3 and two output terminals 4 and 5. In addition, each pulse unit comprises an energy storage field capacitance device 11 and a switching system 12 which are connected in parallel with respect to each other. The input 3 and the outputs 4 and 5 lead out of the switching system 12.

A diode 9 connected in series with a resistor 10, as seen at FIG. 1, is connected between the terminals 1 and the parallel connection of the energy storage field capacitance device 11 and the switching system 12. A supply voltage source 8 is connected on the one hand with the terminal 2 and on the other hand via a switch 6 with the terminals 1 of the pulse units.

The supply voltage source 8 is also applied to the input terminal 3 of the first pulse unit via a switch 7. The output terminal 4 of the first pulse unit is connected to the input terminal 3 of the second pulse unit which in turn is connected via the output terminal 4 to input terminal 3 of the last pulse unit. In order to indicate that the sample embodiment is not restricted to three pulse units, the connections between the second and the third pulse unit have been marked with dotted lines. The output terminals 4 of the pulse units carry signals with the shorter delay time for activating the next pulse unit. The terminals 5 carry signals with the longer delay times, for controlling the corresponding load.

Figure 2:
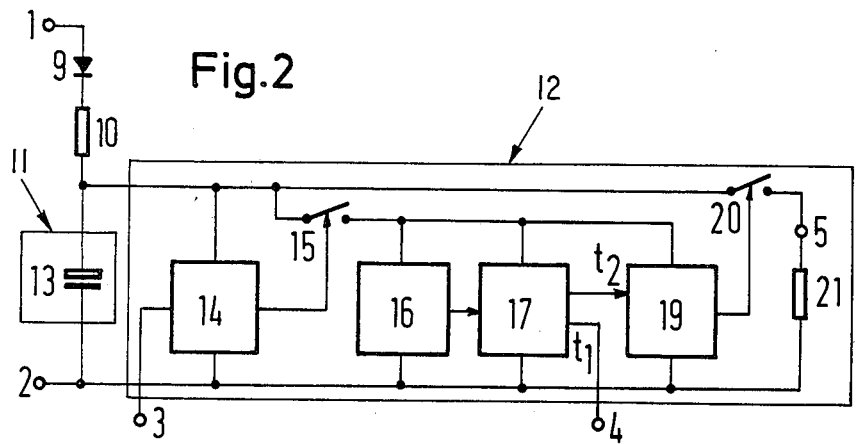
FIG. 2 diagrammatically depicts a switching arrangement of a pulse unit in accordance with the invention.

In FIG. 2 a single pulse unit is illustrated comprising the supply voltage terminals 1 and 2, the input terminal 3 and the output terminals 4 and 5. The energy storage field capacitance device 11 consists in this case of a capacitor 13 which is connected in series with the resistor 10 and the diode 9 between the two supply voltage terminals 1 and 2. The capacitor 13 serves as a supply voltage source and is connected to a first driver 14 via a switch 15 to an oscillator 16, to a frequency divider 17 and to a second driver 19 and via a switch 20 at the output terminal 5, to a load 21. The input of the first driver 14 is connected to the input terminal 3, and its output to the control input of the switch 15. The output of oscillator 16 is connected to the input of the frequency divider 17. The latter has two outputs of which the first one is connected to the output terminal 4 and the second one to the input of the second driver 19. The output of the second driver 19 is connected to the control input of the switch 20. In order to symbolize that the first output of the frequency divider 17 supplies a signal with a shorter delay time to the output terminal 4, a corresponding signal is identified with $t_1$ and in order to show that the second output supplies a signal with a longer delay time, a corresponding signal is identified with $t_2$.

If switch 6 is closed, each energy storage field capacitance device 11, i.e. the capacitor 13 as best seen at FIG. 2, is charged simultaneously via the diodes 9 and the resistor 10. Switches 15 and 20 are open so that the load at the capacitor 13 is maintained. Diode 9 prevents the discharge of the capacitor 13 via the terminals 1 and 2. After charging the energy storages field capacitance device 11, a sequencing of the pulse units connected in series can be activated by closing the switch 7. Subsequent to the closing of switch 7, the first driver 14 causes the closing of switch 15. Thereby, this switch 15 is either constructed to be self-holding switched or the driver 14 causes switch 15 to be closed continuously even when the input terminal 3 no longer carries a pulse. The oscillator 16 and the frequency divider 17 are then activated into operation. The driver 14 of the next pulse unit is activated subsequent to the shorter delay time via the output terminal 4 and via the input terminal 3 of the next pulse unit. Said latter pulse unit in turn triggers the same process for the next pulse unit. After the longer delay time the second driver 19 is triggered which in turn closes switch 20. By means of this, the capacitor 13 is applied to the load 21 via the output terminal 5. The starting information has spread in series during the longer delay time $t_2$ to such an extent that in the case of employing the switching arrangements as dynamite detonators, the transmission of information is not interrupted or effected by the detonation of the first charge.

Figure 3:
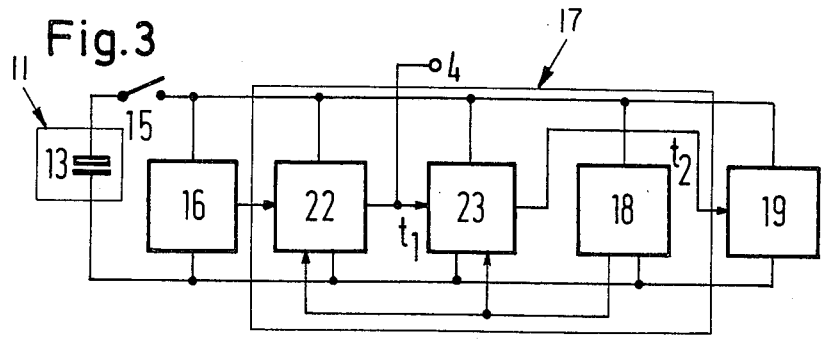
FIG. 3 diagrammatically illustrates a frequency divider including the mentioned switching means for setting the flip-flop in the basic switching state in accordance with the invention.

FIG. 3 shows a detailed illustration of the frequency divider 17 and a switching means 18. The frequency divider 17 consists of two divider steps 22 and 23 which are connected in series. The output of divider step 22 is connected to terminal 4 and the output of divider step 23 to the second driver 19. Furthermore, a switching means 18, as illustrated in FIG. 3, causes, via corresponding inputs of the two divider steps 22 and 23 upon closing of switch 15, a definite basic switching state with the aid of a set pulse. The input of the first divider step 22 is connected with the oscillator 16.

The frequency divider ratio of the first divider step 22 is equivalent to the ratio of the period of the oscillator frequency with respect to the shorter delay time. The divider ratio of the second divider step corresponds to the ratio of the longer delay time with respect to the shorter delay time.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

We claim:
1. In a switching arrangement for a production of sequential current pulses comprising a starting pulse switch, the improvement of
   a plurality of pulse units connected by means of a joint feed line, and in series, producing at each time interval one pulse of a series of pulses and each pulse unit comprising an energy storage capacitance device, a first and second driver, an oscillator, a frequency divider having two outputs for two signals of different delay time, a load, and a pair of switches wherein a first switch is self-holding; wherein
   said energy storage capacitance device in each of said pulse units is
      connected to said joint feed line for purposes of being charged simultaneously;
      connected respectively to said oscillator, said frequency divider, and said second driver by means of said first switch, wherein said first switch is activated respectively by a starting pulse operated on by said first driver upon closing said starting pulse switch in case of said first pulse unit, and by an output signal of the frequency divider having a shorter delay time ($t_1$) of a preceeding serially connected pulse unit for all subsequent pulse units to function as a supply voltage source; and
      further connected across said load by means of a second switch which is activated by an output signal having a longer delay time ($t_2$) of said frequency divider and operated on by said second driver to act as an energy source for the current pulse.

2. In a switching arrangement as defined in claim 1, said frequency divider further comprising two divider steps connected in series and constructed of flip-flops; wherein, a first of said divider steps has a frequency divider ratio of the shorter delay time ($t_1$) to a period of oscillation, and a second of said divider steps has a frequency divider ratio of the longer delay time ($t_2$) to the shorter delay time ($t_1$).

3. In a switching arrangement as defined in claim 2; including a switching means connected to the two divider steps which cause the flip-flops of said divider steps to selectively switch for a set pulse by means of corresponding inputs from the pair of divider steps upon closing of the first switch.

* * * * *